United States Patent [19]

Gates, Jr. et al.

[11] Patent Number: 5,685,071
[45] Date of Patent: Nov. 11, 1997

[54] METHOD OF CONSTRUCTING A SEALED CHIP-ON-BOARD ELECTRONIC MODULE

[75] Inventors: Louis E. Gates, Jr., Westlake Village; Michael D. Runyan, Torrance, both of Calif.

[73] Assignee: Hughes Electronics, Los Angeles, Calif.

[21] Appl. No.: 461,081

[22] Filed: Jun. 5, 1995

[51] Int. Cl.$^6$ .................................................. H05K 3/34
[52] U.S. Cl. ........................... 29/840; 29/832; 174/16.3; 257/712
[58] Field of Search ................. 29/840; 174/16.3; 257/712, 787

[56] References Cited

U.S. PATENT DOCUMENTS

| | | | |
|---|---|---|---|
| 4,650,922 | 3/1987 | McPherson | 257/212 X |
| 4,849,856 | 7/1989 | Funari et al. | 174/16.3 X |
| 4,855,868 | 8/1989 | Harding | 174/52.2 X |
| 5,192,995 | 3/1993 | Yamazaki et al. | |
| 5,199,164 | 4/1993 | Kim et al. | 29/840 |
| 5,206,986 | 5/1993 | Arai et al. | 29/840 |
| 5,296,739 | 3/1994 | Heilbronner et al. | 174/16.3 X |
| 5,315,194 | 5/1994 | Sako | 257/712 X |

FOREIGN PATENT DOCUMENTS

| | | | |
|---|---|---|---|
| 242310 | 1/1987 | Japan | 257/706 |
| 2-346 | 1/1990 | Japan | 257/787 |
| 2-76249 | 3/1990 | Japan | 257/787 |

*Primary Examiner*—Carl J. Arbes
*Attorney, Agent, or Firm*—Leonard A. Alkov; Wanda K. Denson-Low

[57] ABSTRACT

A method of manufacturing an environmentally robust electronic module for aircraft avionics or other military or commercial electronic systems. The method produces a sealed chip-on-board electronic module and comprises the following steps. A printed wiring board is provided having an electrical interconnection circuit printed thereon. Bare integrated circuit chips directly mounted and wirebonded to the printed wiring board. Solderable components are then mounted and conductively connected to the printed wiring board to produce a chip-on-board electronic module. The chip-on-board electronic module is then passivated with silicon nitride to produce a sealed chip-on-board electronic module. The electronic module is passivated by applying a coating of silicon nitride using a plasma enhanced chemical vapor deposition process at a temperature near room temperature so that no stress is induced in the integrated circuit chips or wirebonds of the electronic module. The silicon nitride coating typically has a thickness on the order of one-half micron. After passivation, the sealed chip-on-board electronic module is encapsulated or a cover is disposed thereon.

19 Claims, 1 Drawing Sheet

METHOD OF CONSTRUCTING A SEALED CHIP-ON-BOARD ELECTRONIC MODULE

BACKGROUND

The present invention relates generally to sealed chip-on-board electronic modules, and more particularly, to a method of constructing such electronic modules.

Prior art relating to the manufacturing of high performance avionics modules involves the use of integrated circuit chips enclosed in costly hermetic single chip or multichip packages (known as multichip modules or MCMs) that are typically soldered individually onto a printed wiring board. The prior art devices include conventional avionics modules with surface mount technology (SMT) devices and multichip packages with metallic lead frames mounted on printed wiring boards by soldering. Solder mounted components are known to have reliability problems in hostile military environments where temperature fluctuations impose stress on solder interfaces. Also, multichip packages contain an interconnect substrate (circuit board) that is adhesively bonded to a package base, and the package in turn is bonded to the printed wiring board, adding two ceramic layers and two adhesive layers to the thermal path from the chip to a heat sink.

Consequently, the conventional devices are relatively complex, in that they include two tiers of interconnections, including substrate to package and package to printed wiring board, and four layers of materials that increases the cost and reliability of the devices.

Accordingly, it is an objective of the present invention to provide for a method of constructing sealed chip-on-board electronic modules.

SUMMARY OF THE INVENTION

To meet the above and other objectives, the present invention is a low cost method of manufacturing an environmentally robust electronic module for aircraft avionics or other military or commercial electronic systems. In its broadest aspects, the method produces a sealed chip-on-board electronic module and comprises the following steps. A printed wiring board is provided having an electrical interconnection circuit printed thereon. Bare integrated circuit chips are then directly mounted and wirebonded to the printed wiring board. Solderable components are mounted and conductively connected to the printed wiring board to produce a chip-on-board electronic module. The chip-on-board electronic module is then passivated with silicon nitride by applying a coating of silicon nitride using a plasma enhanced chemical vapor deposition process at a temperature near room temperature so that no stress is induced in the integrated circuit chips or wirebonds of the electronic module. The silicon nitride coating typically has a thickness on the order of one-half micron. After passivation, the sealed chip-on-board electronic module is encapsulated, enclosed, or a cover is disposed thereon.

One distinguishing feature of the present invention is that it provides for direct chip attachment (chip-on-board) and interconnection onto a low cost, fineline interconnect printed wiring board (PWB), as well as soldered surface mount technology (SMT) devices, whichever is most cost effective for fabricating a low cost module. Another distinguishing feature and principal novelty of the present invention is the use of silicon nitride passivation applied to the completed chip-on-board circuitry at a low temperature (near room temperature) by a plasma enhanced chemical vapor deposition process. The final circuit assembly forms a sealed chip-on-board module.

The present invention enables eliminating hermetic packages altogether, thereby saving weight, and eliminating package lead fanout which uses up space on the printed wiring board. The present invention also enhances thermal transfer of heat from integrated circuit chips to heat sinks because the fabricated modules have fewer interfaces between these components. The present invention also reduces assembly costs by reducing or entirely eliminating soldering operations. Direct chip attachment used in the present invention eliminates two tiers of interconnections, including substrate to package, and package to printed wiring board, and four layers of materials that are used in conventional packages.

Integrated circuit chips are directly mounted on a fineline printed wiring board and wirebonded to pads thereon to make circuit interconnections. After direct chip mounting is complete, a coating of silicon nitride is applied by a plasma enhanced chemical vapor deposition process under near room temperature conditions to produce essentially no stress on the integrated circuit chips or wirebonds. The silicon nitride coating provides a moisture barrier that effectively protects the chips, their interconnection pads, and wirebond joints from moisture driven ionic corrosion, consequently, the use of hermetic packages is not necessary. Testing of sealed chip-on-board electronic modules made with the present invention is also simplified by requiting testing only at the fabricated module level.

BRIEF DESCRIPTION OF THE DRAWINGS

The various features and advantages of the present invention may be more readily understood with reference to the following detailed description taken in conjunction with the accompanying drawings, wherein like reference numerals designate like structural element, and in which.

DETAILED DESCRIPTION

Figure 1:
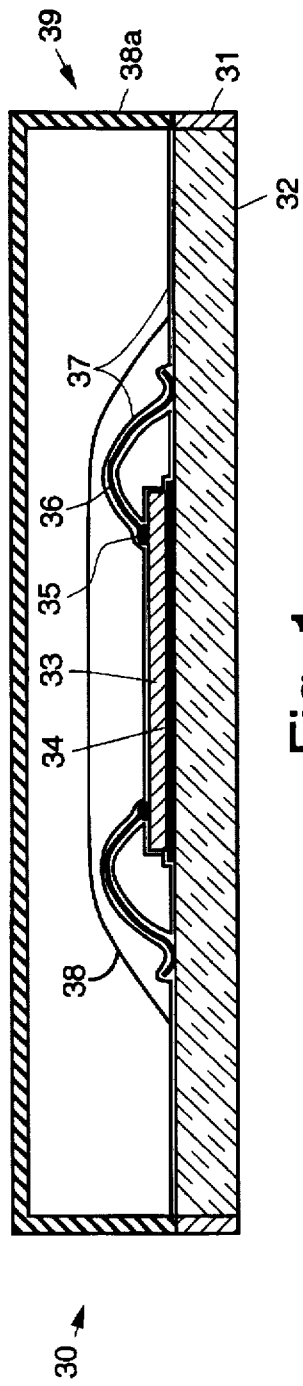
FIG. 1 illustrates a sealed chip-on-board electronic module made in accordance with the principles the present invention.
Figure 2:
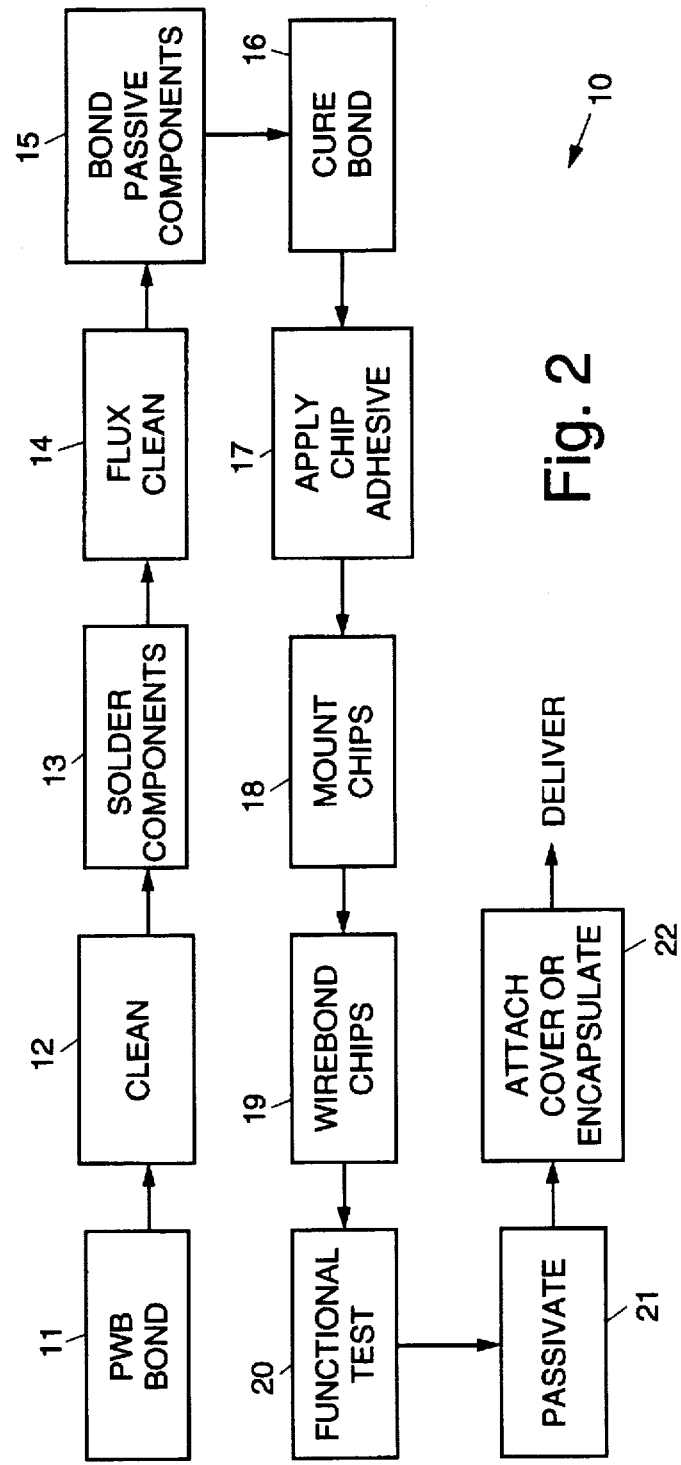
FIG. 2 illustrates a method of constructing such sealed chip-on-board electronic modules in accordance with the principles of the present invention.

Referring to the drawing figures, FIG. 1 illustrates a sealed chip-on-board electronic module 30 and FIG. 2 illustrates a method 10 of constructing the sealed chip-on-board electronic module 30 in accordance with the present invention. The exemplary module 30 shown in FIG. 1 includes a heat sink 31, which may be cooled using either conduction or fluid flow flow-through cooling, for example, and one or more printed wiring boards 32 mounted to the heat sink 31. However, it is to be understood that the heat sink 31 is not always required, and that the present invention does not require the use of a heat sink 31. Appropriate connectors are provided to permit interconnection of the printed wiring boards 32 to each other, in the case of multiple boards 32, and to other modules 30 through an external backplane (not shown).

Integrated circuit chips 33 are bonded by means of adhesive 34 to the printed wiring board 32. The integrated circuit chips 33 are wirebonded using bumps 35 and wirebonds 36 to electrically couple the integrated circuit chips 33 to the printed wiring board 32. The module 30, including integrated circuit chips 33, passive components as required, and the bumps 35 and wirebonds 36 are passivated with a passivation layer 37. An encapsulant 38 is disposed over the wirebonded integrated circuit chips 33, or a cover 38a is disposed over the circuitry of the module 30 in a conventional manner.

If some integrated circuit chips 33 are more inexpensively obtained as packaged devices, or they are simply not obtainable is bare chips, it may be more costwise expedient to use a limited number of packaged devices on the module 30 which replace certain of the integrated circuit chips 33. It is an objective of the present invention to use the most cost effective approach possible in order to keep final module costs as low as practical.

In accordance with the present method, and referring to FIG. 2, printed wiring boards 32 are mounted onto the heat sink 31 and bonded thereto by means of adhesive 34 to form a printed wiring board and heat sink assembly 39, illustrated in step 11. The printed wiring boards 32 are then cleaned, illustrated in step 12. Other solderable components such as oscillators, and the like, resistors and capacitors may also be mounted by using conductive adhesive 34 or by soldering leads, illustrated in step 13. Flux is then cleaned from the printed wiring boards 32, illustrated in step 14. Passive components such as resistors and capacitors, are then bonded to the printed wiring boards 32, illustrated in step 15. The bonded components are then cured, illustrated in step 16.

Integrated circuit chip adhesive is then applied to the printed wiring boards 32, illustrated in step 17. Integrated circuit chips 33 are then mounted to the printed wiring boards 32 using the chip adhesive 34, illustrated in step 18. The integrated circuit chips 33 are then wirebonded to electrical circuits printed on the printed wiring boards 32 using wirebonds 36, illustrated in step 19. The above processing fabricates a functional chip-on-board electronic module 30.

The fabricated and functional chip-on-board electronic module 30 is then tested, illustrated in step 20. Once the chip-on-board electronic module 30 is tested, it is passivated with silicon nitride to provide the passivation layer 37 using equipment and processes described in U.S. Pat. No. 4,262,631, for example, illustrated in step 21. Typically, a 0.5 μm coating of silicon nitride is applied by the plasma enhanced chemical vapor deposition process under near room temperature conditions to produce essentially no stress on the integrated circuit chips 33 or wirebonds 36. This produces the sealed chip-on-board electronic module 30. The passivated or sealed chip-on-board electronic module 30 is then encapsulated or enclosed (illustrated as the encapsulant layer 38 in FIG. 1) or has the cover 38a (FIG. 1) attached thereto to produce a fully fabricated module 30, illustrated in step 22. The fully fabricated module 30 is then ready for use or delivery.

The present invention reduces assembly costs by eliminating soldering processes. Direct chip attachment used in the present invention eliminates two tiers of interconnections, including substrate to package, and package to printed wiring board, and four layers of materials commonly used in conventional packages. The present invention thus permits the production of avionics systems at a much lower cost, while at the same time providing high performance, high reliability electronic circuits.

In order to verify the practicality of the present invention, a single module 30 processing element was satisfactorily fabricated and tested, and was found to be fully functional as designed, proving the viability of the combination of technologies required to produce the module 30.

Thus, methods of constructing sealed chip-on-board electronic modules have been disclosed. It is to be understood that the above-described embodiment is merely illustrative of some of the many specific embodiments that represent applications of the principles of the present invention. Clearly, numerous and other arrangements can be readily devised by those skilled in the art without departing from the scope of the invention.

What is claimed is:

1. A method of manufacturing a sealed chip-on-board electronic module, said method comprising the steps of:

providing a printed wiring board having an electrical interconnection circuit printed thereon;

mounting and electrically connecting solderable components to the printed wiring board;

mounting and wirebonding integrated circuit chips directly to the printed wiring board;

passivating the chip-on-board electronic module to produce a sealed chip-on-board electronic module; and encapsulating the sealed chip-on-board electronic module.

2. The method of claim 1 wherein the step of passivating the chip-on-board electronic module comprises the step of applying a coating of silicon nitride using a plasma enhanced chemical vapor deposition process under near room temperature conditions that causes no stress on the integrated circuit chips and wirebonds of the electronic module.

3. The method of claim 1 wherein the coating comprises a silicon nitride layer having a thickness on the order of one-half micron.

4. The method of claim 1 further comprising the steps of:

bonding passive components to the printed wiring board; and curing the bonded components.

5. The method of claim 1 wherein the step of mounting and wirebonding integrated circuit chips comprises the steps of:

applying integrated circuit chip adhesive to predetermined integrated circuit chip locations on the printed wiring board;

mounting integrated circuit chips to the printed wiring board using the chip adhesive; and wirebonding the integrated circuit chips to the electrical interconnection circuit printed on the printed wiring board.

6. The method of claim 1 wherein the step of encapsulating the sealed chip-on-board electronic module comprises the step of encapsulating the wirebonded chips with an encapsulant.

7. The method of claim 1 further comprising the step of disposing a cover on the encapsulated chip-on-board electronic module.

8. A method of manufacturing a sealed chip-on-board electronic module, said method comprising the steps of:

providing a printed wiring board having an electrical interconnection circuit printed thereon;

mounting the printed wiring board directly onto a heat sink;

mounting and conductively connecting solderable components to the printed wiring board;

mounting and wirebonding integrated circuit chips directly onto the printed wiring board;

passivating the chip-on-board electronic module with silicon nitride by applying a coating of silicon nitride using a plasma enhanced chemical vapor deposition process at near room temperature that causes no stress on the integrated circuit chips or wirebonds of the electronic module to produce a sealed chip-on-board electronic module; and encapsulating the sealed chip-on-board electronic module.

9. The method of claim 8 wherein the coating comprises a silicon nitride layer having a thickness on the order of one-half micron.

10. The method of claim 8 further comprising the steps of:

bonding passive components to the printed wiring board prior to mounting the integrated circuit chips; and curing the bonded components.

11. The method of claim 10 wherein the step of mounting and wirebonding integrated circuit chips comprises the steps of:

applying integrated circuit chip adhesive to predetermined integrated circuit chip locations on the printed wiring board;

mounting integrated circuit chips to the printed wiring board using the chip adhesive; and wirebonding the integrated circuit chips to the electrical interconnection circuit printed on the printed wiring board.

12. The method of claim 8 wherein the step of encapsulating the sealed chip-on-board electronic module comprises the step of encapsulating wirebonded chips with an encapsulant.

13. The method of claim 11 further comprising the step of attaching a cover to the sealed chip-on-board electronic module.

14. A method of manufacturing a sealed chip-on-board electronic module, said method comprising the steps of:

providing a printed wiring board having an electrical interconnection circuit printed thereon;

cleaning the printed wiring board;

mounting and conductively connecting solderable components to the printed wiring board;

cleaning flux from the printed wiring board;

bonding passive components to the printed wiring board;

curing the bonded components;

applying integrated circuit chip adhesive to predetermined integrated circuit chip locations on the printed wiring board;

mounting integrated circuit chips to the printed wiring board using the chip adhesive;

wirebonding the integrated circuit chips to the electrical interconnection circuit on the printed wiring board to produce a functional chip-on-board electronic module;

passivating the chip-on-board electronic module with silicon nitride to produce a sealed chip-on-board electronic module; and encapsulating the sealed chip-on-board electronic module.

15. The method of claim 14 further comprising the step of mounting and bonding the printed wiring board directly onto a heat sink.

16. The method of claim 14 wherein the step of passivating the chip-on-board electronic module comprises the step of applying a coating of silicon nitride using a plasma enhanced chemical vapor deposition process under near room temperature conditions that causes no stress on the integrated circuit chips or wirebonds of the electronic module.

17. The method of claim 14 wherein the coating comprises a silicon nitride layer having a thickness on the order of one-half micron.

18. The method of claim 14 wherein the step of enclosing the sealed chip-on-board electronic module comprises the step of attaching a cover to the sealed chip-on-board electronic module.

19. The method of claim 14 further comprising the step of testing the chip-on-board electronic module prior to passivating it.

* * * * *